United States Patent
Yamada et al.

(10) Patent No.: US 6,429,031 B2
(45) Date of Patent: Aug. 6, 2002

(54) METHOD FOR FORMING WIRING PATTERN OF A SEMICONDUCTOR INTEGRATED CIRCUIT

(75) Inventors: Makoto Yamada; Mitsuo Ito, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/725,268

(22) Filed: Nov. 29, 2000

(30) Foreign Application Priority Data

Nov. 30, 1999 (JP) ............................................. 11-340181
Sep. 19, 2000 (JP) ......................................... 2000-283359

(51) Int. Cl.⁷ ......................... H01L 21/82; H01L 21/20; H01L 21/66
(52) U.S. Cl. .......................... 438/14; 438/128; 438/584; 438/598; 716/5
(58) Field of Search ............................ 438/14, 17, 128, 438/129, 584, 597, 598, 669; 716/5, 7, 11

(56) References Cited

U.S. PATENT DOCUMENTS 5,831,870 A * 11/1998 Folta et al. .................. 364/490
6,124,197 A * 9/2000 Fulford ........................ 438/618
6,275,971 B1 * 8/2001 Levy et al. ...................... 716/5

FOREIGN PATENT DOCUMENTS

JP 9-64153 * 3/1997

* cited by examiner

Primary Examiner—T. N. Quach
(74) Attorney, Agent, or Firm—Arent Fox Kintner Plotkin & Kahn, PLLC

(57) ABSTRACT

A method and apparatus for connecting wiring patterns of an integrated circuit device. A wiring pattern of a semiconductor integrated circuit includes a first line for conducting a first potential and a second line for conducting a second potential. The method detects a portion of a distal end of the first line that overlaps a distal end of the second line and generates an avoidance pattern by eliminating the overlapping portion from the first line.

14 Claims, 10 Drawing Sheets

METHOD FOR FORMING WIRING PATTERN OF A SEMICONDUCTOR INTEGRATED CIRCUIT

BACKGROUND OF THE INVENTION

The present invention relates to a method for forming a wiring pattern of a semiconductor integrated circuit, and more particularly, to a method for forming a wiring pattern of a semiconductor integrated circuit including a plurality of circuit modules.

When designing a semiconductor integrated circuit device, a plurality of module sections at which modules are arranged are first defined on a semiconductor substrate. Then, a plurality of circuit elements are arranged in each of the module sections to form a module in each module section. Afterward, the layout of signal lines for transferring data and power lines for supplying power to each of the modules is designed.

Figure 1:
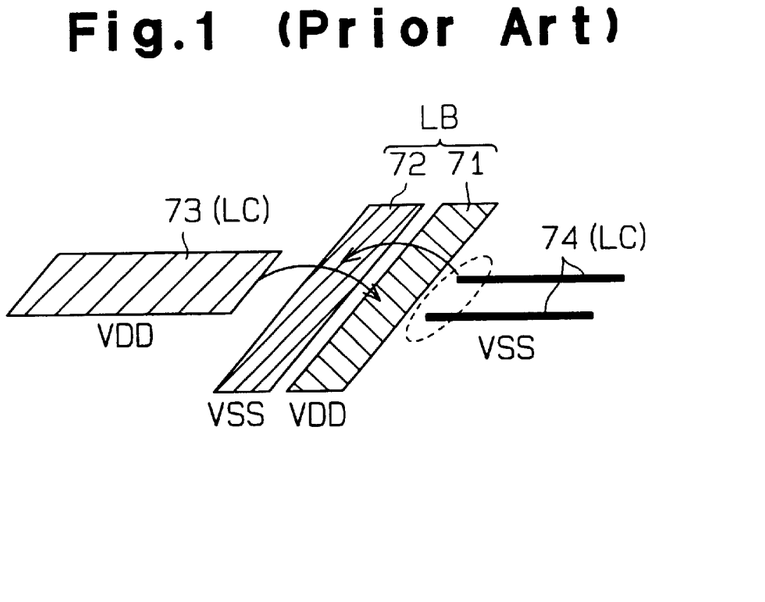
FIG. 1 is a schematic perspective view showing connected pairs of power lines.

The wiring of the signal and power lines are designed for each circuit net, which is provided with the same signal and/or power. Thus, when two nets are located on the same wiring layer, the signal and power supply lines of one net may interfere with the signal and power supply lines of the other net. FIG. 1 shows an example of a power supply line connection. A first middle line 71, which supplies power VDD, and a second middle line 72, which supplies power VSS, which potential differs from power VDD, are arranged on a lower wiring layer LB. A left line 73 and right lines 74 for supplying power are arranged on an upper wiring layer LC. When connecting the left line 73 and the first middle line 71 and the right line 74 and the second middle line 72, the left and right power supply lines 73, 74 interfere with each other on the upper wiring layer LC.

Figure 2:
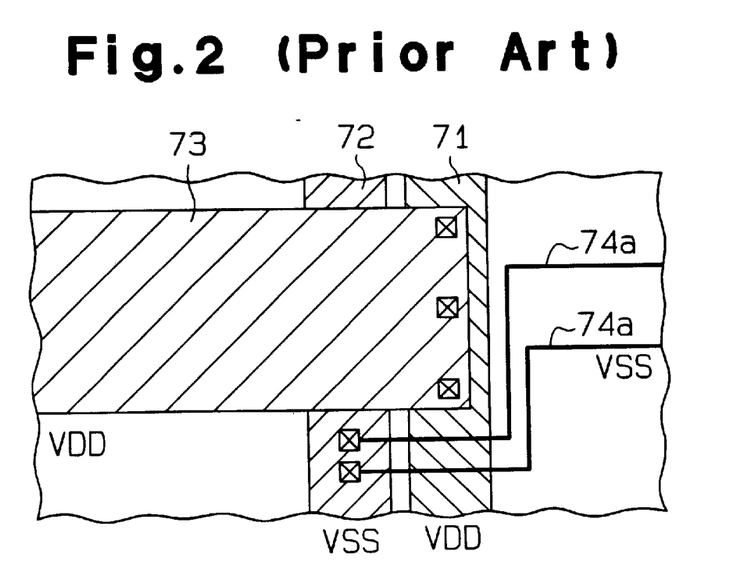
FIGS. 2 to 5 are schematic diagrams showing wiring patterns laid out in accordance with prior art wiring methods.
Figure 3:
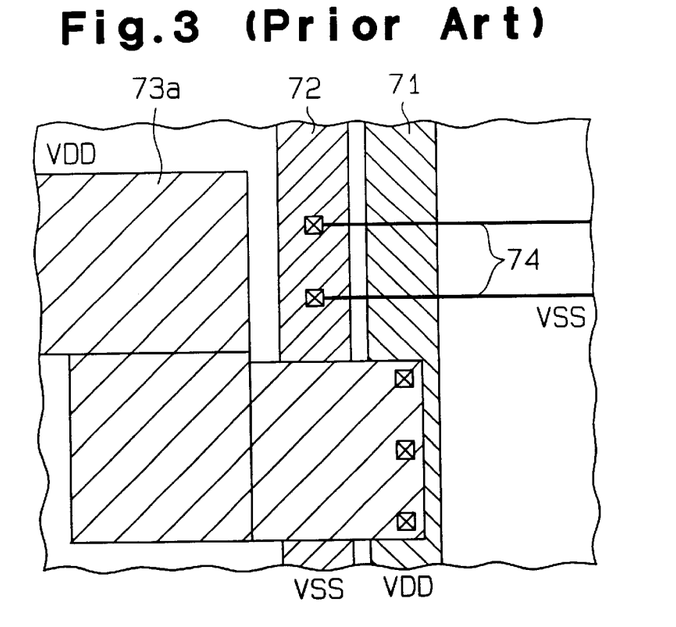

Therefore, in a first prior art wiring method, right bent lines 74a are arranged on the upper wiring layer LC to avoid the left line 73, as shown in FIG. 2. This enables connection of the left power supply line 73 to the first middle line 71 and the connection of the right bent lines 74a to the second middle line 72. Alternatively, as shown in FIG. 3, a left bent line 73a may be arranged on the upper wiring layer LC to avoid the right lines 74.

Figure 4:
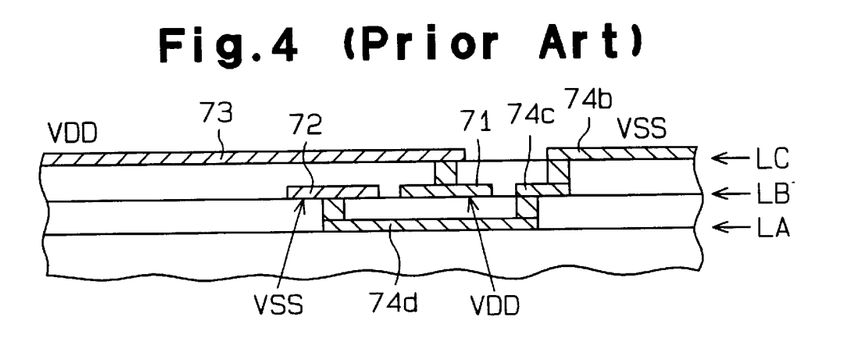

A second prior art wiring method is shown in FIG. 4. Right lines 74b, 74c, 74d are arranged on wiring layers LC, LB, LA, respectively. The line 74d extends beneath the first middle line 71 and is connected to the second middle line 72.

Figure 5:
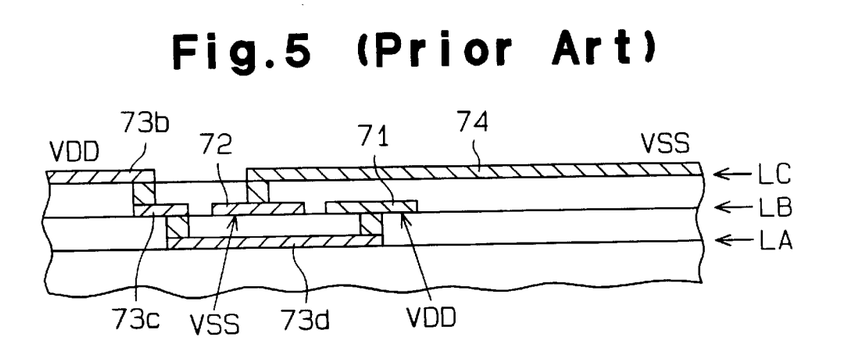

Alternatively, as shown in FIG. 5, left lines 73b, 73c, 73d may be arranged on the wiring layers LC, LB, LA, respectively. The line 73d extends beneath the second middle line 72 and is connected to the first middle line 71.

The first and second wiring methods were also combined in the prior art.

However, in the prior art methods, for example, a clearance must be provided about a line even if the width and capacity of the line is greater than necessary. This decreases the area available for other lines. Although this would cause no problem if the semiconductor substrate has sufficient space, this does cause problems if other power and signal lines or cell patterns already occupy the substrate. In such case, the space for avoiding other lines is insufficient. Further, since line bonding is hindered, the layout of peripheral circuits must be redesigned. This prolongs the design time and increases the circuit area and the chip dimension.

SUMMARY OF THE INVENTION

It is an object of the present invention to provide a method for designing a wiring pattern of a semiconductor integrated circuit that connects a plurality of lines having different potentials within a small area.

To achieve the above object, the present invention provides a method for forming a wiring pattern of a semiconductor integrated circuit including a first line for conducting to a first potential and a second line for conducting to a second potential. The method includes detecting a portion of a distal end of the first line that overlaps a distal end of the second line, and generating a first avoidance pattern by eliminating the overlapping portion from the first line.

A further aspect of the present invention provides an apparatus for forming a wiring pattern of a semiconductor integrated circuit including a first line for conducting a first potential and a second line for conducting a second potential. The apparatus includes a detector for detecting a portion of a distal end of the first line that overlaps a distal end of the second line, and a processor including an avoidance pattern generator for generating a first avoidance pattern by eliminating the overlapping portion from the first line.

Another aspect of the present invention provides a computer readable storage medium storing a program for forming a wiring pattern of a semiconductor integrated circuit including a first line for conducting a first potential and a second line for conducting a second potential. The program includes the steps of detecting a portion of a distal end of the first line that overlaps a distal end of the second line, and generating a first avoidance pattern by eliminating the overlapping portion from the first line.

A further aspect of the present invention provides a semiconductor integrated circuit device including a first power line for conducting a first potential, a second power line for conducting a second potential, which differs from the first potential, and arranged parallel to the first power line, a third power line extending transversely to the second power line and connected to the first power line, and a fourth power line extending transversely to the first power line and connected to the second power line. The third power line has a plurality of distal portions including a first distal portion and a second distal portion, and the fourth power line has a distal portion arranged between the first and second distal portions.

Another aspect of the present invention provides a method for connecting lines in a semiconductor integrated circuit including a first line for conducting a first potential, a second line for conducting a second potential, a third line for conducting the first potential, and a fourth line for conducting the second potential. The first and second lines are arranged on a first layer, and the third and fourth lines are arranged on a second layer. The first line is connected to the third line, and the second line is connected to the fourth line. The method includes detecting a portion of a distal end of the third line that overlaps a distal end of the fourth line, generating a first avoidance pattern by eliminating the overlapping portion from the third line, temporarily storing data of the first avoidance pattern in a memory, determining whether the first avoidance pattern satisfies a predetermined wiring requirement, forming a new third line having the first avoidance pattern when the wiring requirement is satisfied, and forming via holes connecting the first line to the new third line and the second line to the fourth line.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 7:
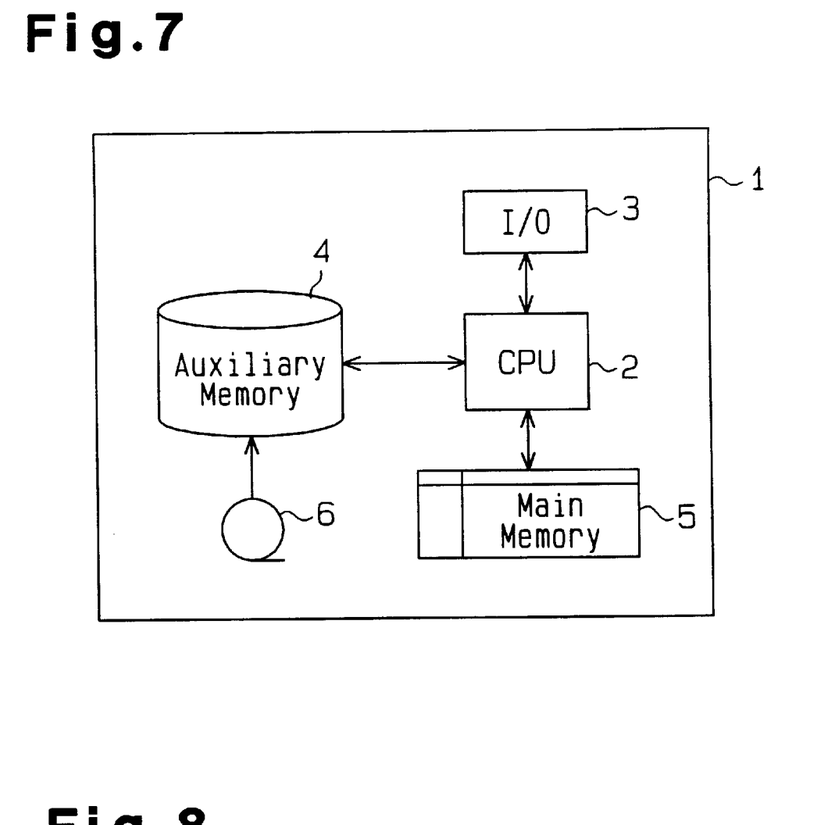
FIG. 7 is a schematic block diagram of a wiring pattern formation apparatus according to a preferred embodiment of the present invention.

FIG. 7 is a schematic block diagram showing a wiring pattern formation apparatus according to a preferred embodiment of the present invention. The wiring pattern formation apparatus 1 includes a central processing unit (CPU) 2, an I/O device 3, an auxiliary memory 4, and a main memory 5. The I/O device 3 and memories 4, 5 are connected to the CPU 2.

The I/O device 3 includes a keyboard and a mouse, which are used to input parameters and commands, a monitor, such as a VDT, and a printer (none are shown), which display wiring pattern images and processing results.

Figure 6:
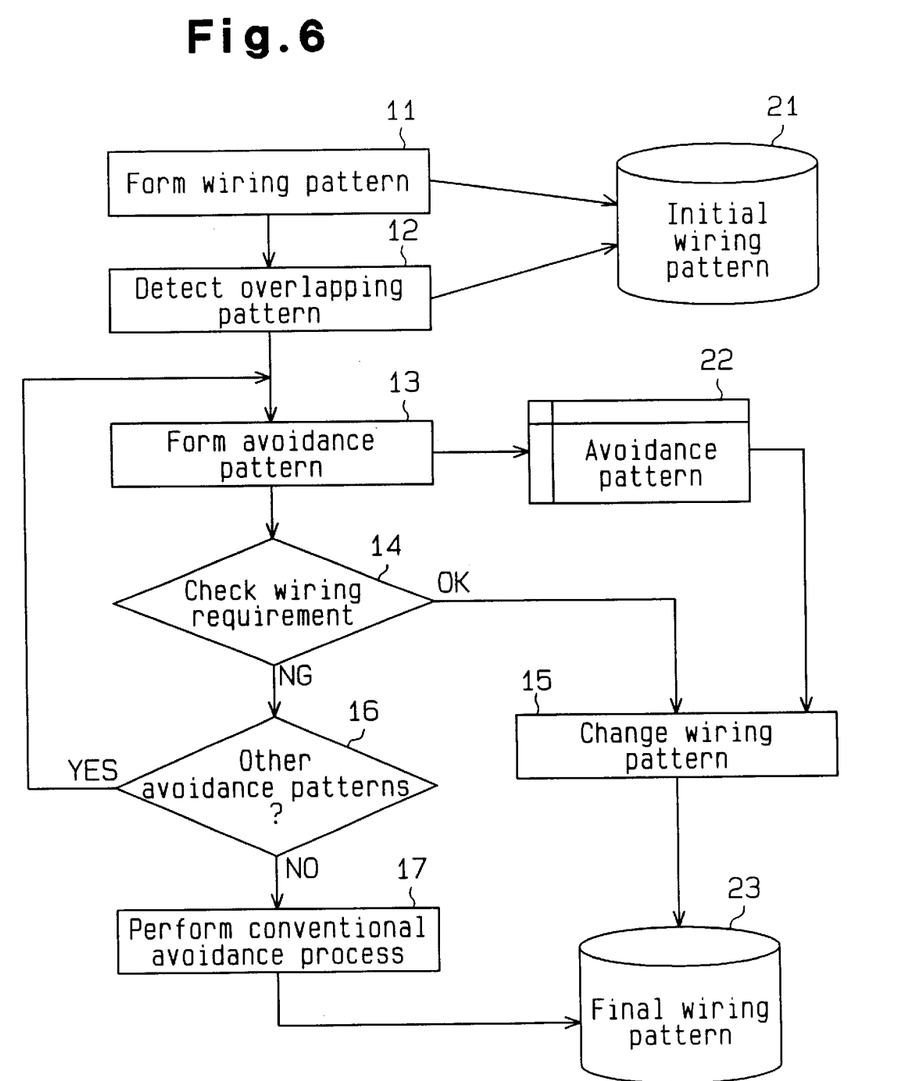
FIG. 6 is a flowchart of a wiring pattern formation process according to a preferred embodiment of the present invention.

The auxiliary memory 4 is, for example, a magnetic memory, an optical memory, or a magneto-optical memory, used to store programs and data used in a wiring pattern formation process, which is illustrated in FIG. 6. The CPU 2 is activated in response to commands from the I/O device 3 to execute the wiring pattern formation process in accordance with the flowchart of FIG. 6.

The main memory 5 provides data at a speed higher than that of the auxiliary memory 4. The CPU 2 stores in the main memory 5 relatively small volumes of data and temporary data undergoing processing.

The program data for the wiring pattern formation process is stored on a storage medium 6. The storage medium 6 is a computer readable medium, such as a flexible disk, a CD-ROM, a hard disk, a memory card, a ROM, a punch card, or a tape.

The storage medium 6 may also be the main memory or auxiliary memory of another computer that stores data provided via a communication medium. Further, the storage medium 6 need not store programs executed directly by a computer. For example, the storage medium 6 may store programs installed in other storage media (e.g., hard disk) or store encoded or compressed programs.

The CPU 2 first copies or installs the program data of the storage medium 6 in the auxiliary memory 4, and the auxiliary memory 4 loads the program data to the main memory 5. Alternatively, the CPU 2 may directly load the program data of the storage medium 6 to the main memory 5.

If the program data is stored in a computer connected to the wiring pattern formation apparatus 1 via a communication medium, the program data received through the communication medium is copied or installed to the auxiliary memory 4, and then loaded to the main memory 5 and executed.

The wiring pattern formation process will now be discussed with reference to the flowchart of FIG. 6.

At step 11, a wiring pattern formation process is performed. The CPU 2 forms the wiring patterns of all of the power supply lines and signal lines based on logical design data and module arrangement data, and stores wiring pattern data in an initial file 21 of the auxiliary memory 4.

At step 12, an overlapping pattern detection process is performed. Based on the wiring pattern data stored in the initial file 21, the CPU 2 detects whether a distal end of one line is overlapping the distal end of another line (different potential line). The different potential line may be a power line for providing a different potential or a signal line for providing a different signal.

At step 13, an avoidance pattern formation process is performed. To eliminate the detected overlapping portions, the CPU 2 eliminates the overlapping portion of a wider one of two (or more) overlapping lines to form an overlap avoidance pattern and stores the avoidance data pattern in an avoidance pattern file 22 of the main memory 5. The avoidance pattern file 22 may also be stored in the auxiliary memory 4.

At step 14, a wiring condition checking process is performed. The CPU 2 checks whether lines having the avoidance pattern satisfy predetermined requirements at their associated positions. The conditions include current density, voltage drop, via area, capacitance, resistance, current amount, and signal speed. When the requirements are satisfied, the CPU 2 proceeds to step 15.

At step 15, an avoidance pattern application process, or a line data changing process, is performed. In accordance with the data of the avoidance pattern file 22, the CPU 2 changes the wiring pattern data in the initial file 21, generates final wiring pattern data, and stores the data in a final wiring pattern file 23. It is preferred that data related with overlapping lines in the initial file 21 be replaced by the data of the avoidance pattern file 22 in step 15.

The data in the avoidance pattern file 22 is temporary data used for checking if the wiring requirements are satisfied. If the data of the avoidance pattern file 22 does not satisfy the wiring requirements, the CPU 2 uses the original wiring pattern data and re-generates a new avoidance pattern. More specifically, if a wiring condition is not satisfied in step 14, the CPU 2 proceeds to step 16.

Step 16 is a determination process in which the CPU 2 determines whether the formation of a second avoidance pattern is possible. A second method for forming the second avoidance pattern will now be discussed. If the width difference between two associated lines is small and if a first line does not satisfy its requirements when an overlapping portion of the first line is eliminated, a second line is first divided into a plurality of narrow lines. Then, a portion of the first line overlapping a narrow line is eliminated. The remaining narrow lines are bent to avoid the first line. It is preferred that the total width of the plurality of narrow lines be substantially equal to the width of the second line prior to the division. Accordingly, in the second method, the requirements are satisfied even if the overlapping portion is eliminated.

As long as the wiring requirements of the second line are satisfied, the widths of the narrow lines may be the same or different. For example, the second line may be divided into a plurality of narrow lines having equal widths. Alternatively, when dividing the second line into a plurality of narrow lines, the second line may be divided so that the narrow line overlapping the first line is narrower or wider than other narrow lines.

At step 16, if the CPU 2 determines that the second avoidance pattern can be formed through the second method, the processing returns to step 13 and forms the second avoidance pattern in accordance with the second method.

If the CPU 2 determines that the second avoidance pattern cannot be formed through the second method in step 16, the CPU 2 proceeds to step 17. An avoidance process in accordance with the conventional method is performed in step 17. The CPU 2 forms the wiring pattern in accordance with the prior art methods shown in FIGS. 2 to 5. Then, the CPU 2 stores the wiring pattern data in the final file 23.

The processing of FIG. 6 performed by the wiring pattern formation apparatus 1 will now be discussed with reference to FIGS. 8 to 14.

Figure 8:
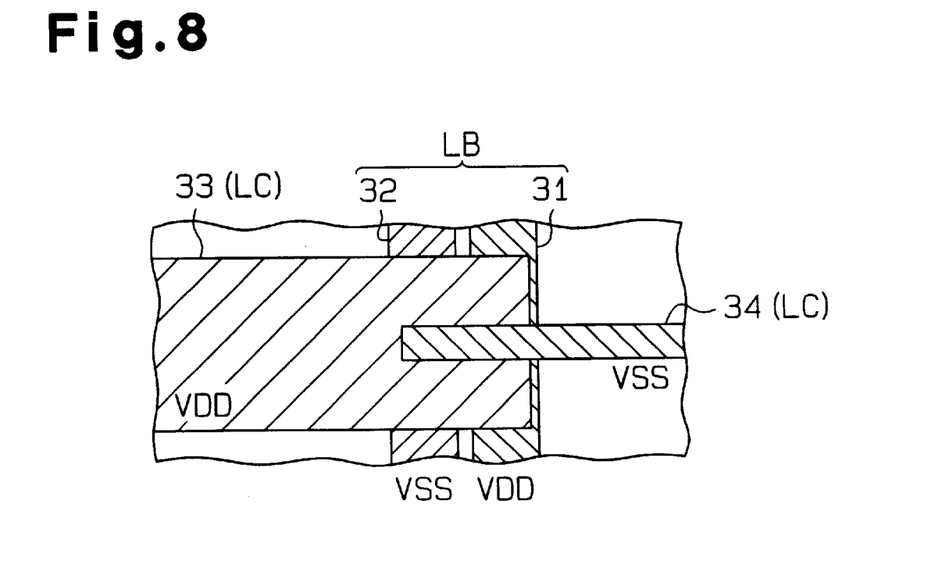
FIG. 8 is a schematic diagram showing an overlapping portion of a wiring pattern.

At step 11, a wiring pattern shown in FIG. 8 is generated. In the wiring pattern of FIG. 8, a lower right power line 31 and a lower left power line 32 are formed on a lower line layer LB. An upper left power line 33 and an upper right power line 34 are formed on an upper line layer LC. The power lines 31, 33 are used to supply a first potential VDD, and the power lines 32, 34 are used to supply a second potential VSS.

Figure 9:
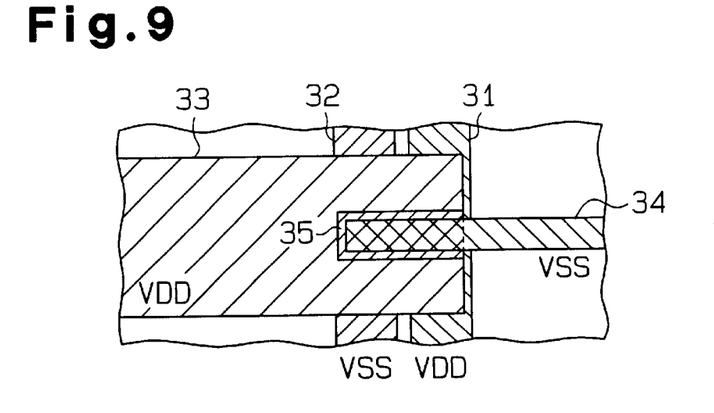
FIG. 9 is a schematic diagram showing the distal shape of a line that avoids line overlapping.

In the state of FIG. 8, the CPU 2 detects the distal end of the power line 34 overlapping the power line 33 (step 12). Referring to FIG. 9, to avoid overlapping, the CPU 2 determines an elimination area 35 such that a clearance satisfying predetermined designing standards is defined between the two lines 33, 34.

Figure 10:
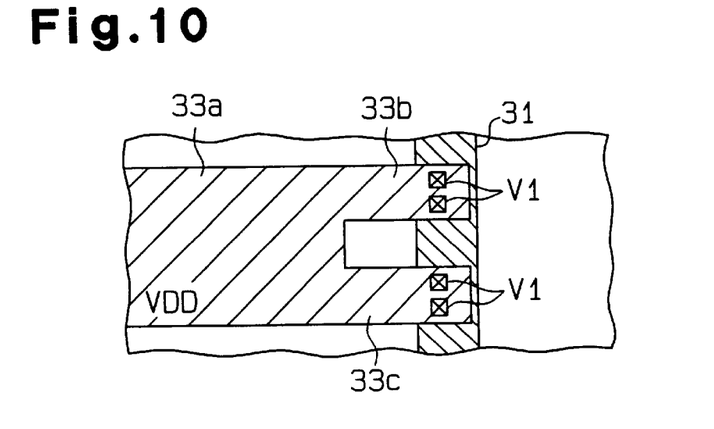
FIG. 10 is a schematic diagram showing a line having a distal end formed in the same manner as the line end of FIG. 9.

The elimination area 35 is then eliminated from the upper left power line 33, the width of which is greater than the upper right power line 34, to form the avoidance pattern. With reference to FIG. 10, this forms a main body 33a and two distal portions 33b, 33c extending from the main body 33a in the upper left power line 33. The width of the main body 33a is the same as the original power line 33. The avoidance pattern includes a plurality of via holes V1 connecting the two distal portions 33b, 33c to the lower right power line 31.

The CPU 2 then checks whether or not the two distal portions 33b,-33c satisfy predetermined power line requirements using a predetermined checking method (step 14). The power line requirements include the current density of the two distal portion being greater than a predetermined value, and the total area of the via holes V1 being greater than a predetermined via area.

Figure 11:
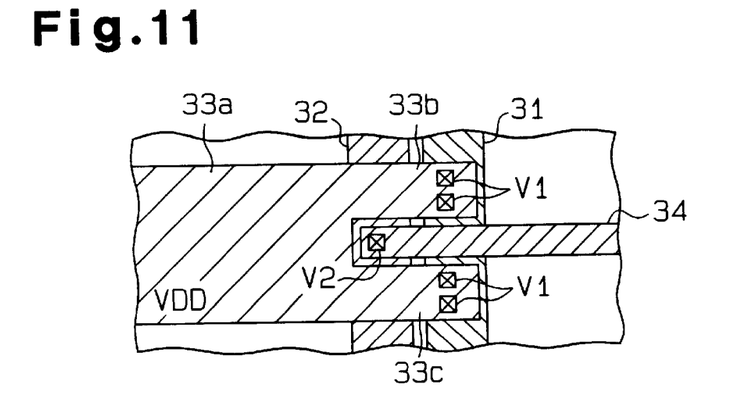
FIG. 11 is a schematic diagram showing a line that avoids line overlapping.

When the power line requirements of the two distal portions 33b, 33c are satisfied, the shapes of the power line 33 and the via holes V1 are finalized. In this case, the distal portions 33b, 33c are connected to the lower line 31 through the via holes V1. Then, as shown in FIG. 11, the line 34 is connected to the lower line 32 through a via hole V2. That is, in step 15, a new wiring pattern having the overlapping avoidance pattern generated in step 13 is generated, and the final wiring pattern data including the new wiring data is stored in the final file 23.

If the two distal portions 33b, 33c and the plurality of via holes V1 do not satisfy the predetermined power line requirements, the CPU 2 determines whether or not a second avoidance pattern can be formed (step 16). If the second avoidance pattern can be formed, the avoidance pattern is generated (step 13). Then, the CPU 2 checks whether the avoidance pattern satisfies the power line requirements (step 14).

Figure 14:
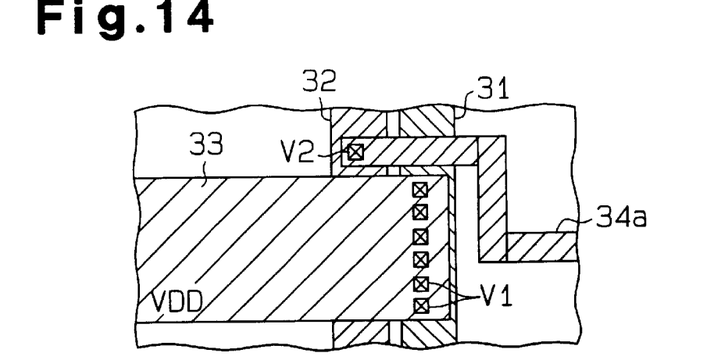
FIG. 14 is a schematic diagram showing an interference avoidance pattern formed using the prior art wiring methods.

If a second avoidance pattern cannot be formed, as shown in FIG. 14, for example, the upper right power line 34 is bent in accordance with the first prior art method to form a bent line 34a and the bent line 34a is connected to the lower left power line 32 through a via hole V2 (step 17). Then, for example, the via area, or the number of via holes V1, is increased to satisfy the power line requirements and connect the upper left power line 33 to the lower right power line 31. This prevents violation of the power line requirements and non-connection of the power lines. In step 17, the second prior art method or a combination of the first and second prior art methods may also be performed.

Figure 12:
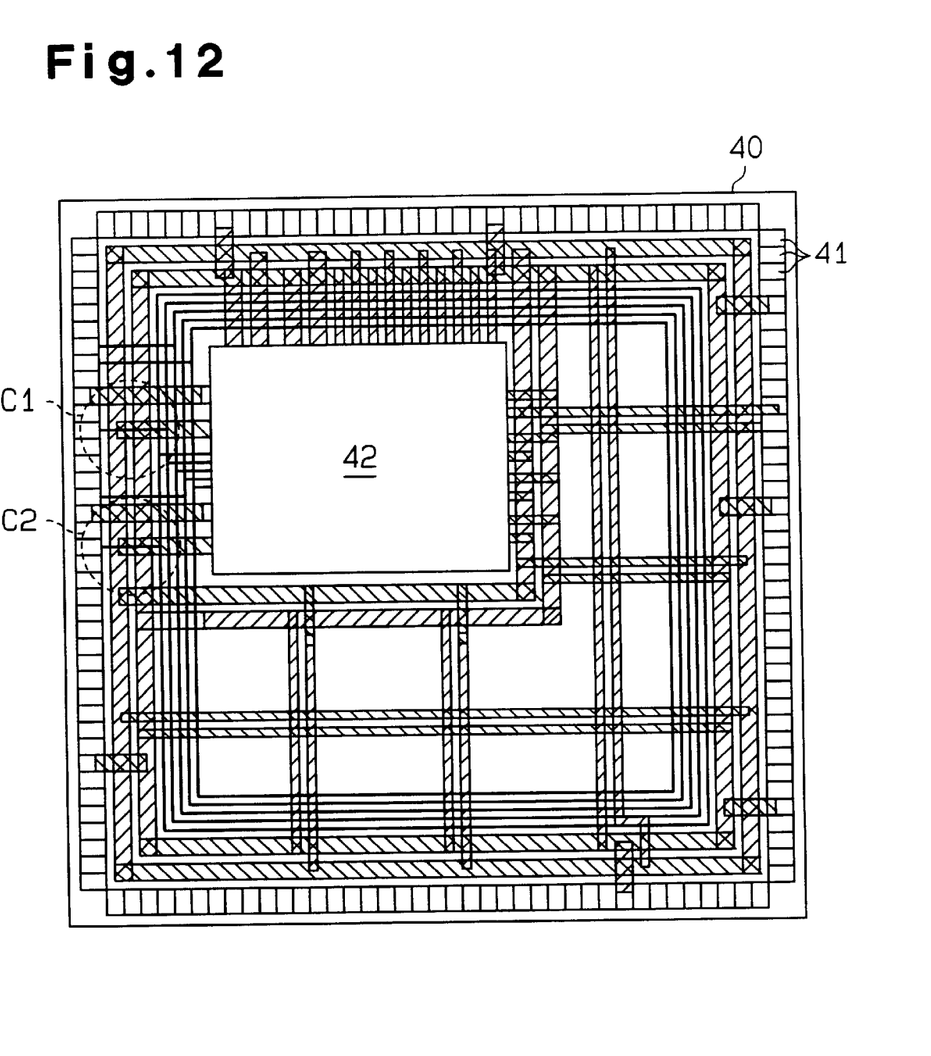
FIG. 12 is a schematic plan view showing a semiconductor integrated circuit device according to a preferred embodiment of the present invention.
Figure 13:
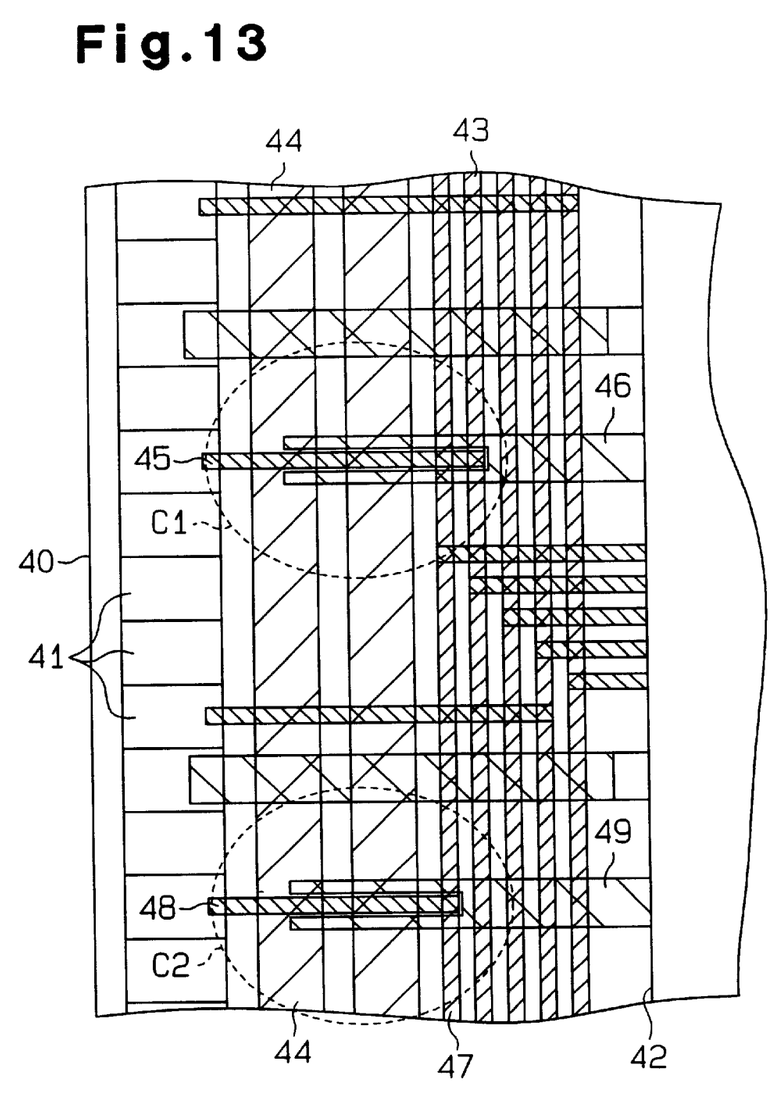
FIG. 13 is an enlarged partial view of the semiconductor integrated circuit device of FIG. 12.

FIG. 12 is a plan view showing a semiconductor integrated circuit 40 having power lines designed through the processing method of the preferred embodiment. FIG. 13 is a partial enlarged view of FIG. 12.

A plurality of I/O cells 41, which serve as an external signal interface (I/F), are arranged along the periphery of the semiconductor integrated circuit 40. A macro cell 42 and an internal cell (not shown) are arranged at the inner side of the I/O cells 41. A plurality of power lines extend in longitudinal and lateral directions, as viewed in FIG. 13, to supply power from the I/O cells 41 to the macro cell 42 and the inner cell. The power lines are formed on a plurality of wiring layers. Via holes (not shown) connect the power lines arranged on different wiring layers. In FIGS. 12 and 13, the power lines are shown by different hatchings, and signal lines are not shown.

In FIG. 13, the power lines encircled by the dotted line C1 are formed through the wiring pattern formation process. More specifically, a first power line 43 and a second power line 44 are formed to extend in the longitudinal direction of FIG. 13. A third power line 45 extends transversely to the second power line 44 and is connected to the first power line 43 through a via hole (not shown). A fourth power line 46 extends transversely to the first power line 43 and is connected to the second power line 44 through a via hole (not shown).

The fourth power line 46 has two distal portions extending from its main body. The two distal portions are connected to the second power line 44. The third power line 45 extends through the space defined between the two distal portions and is connected to the first power line 43.

In FIG. 13, the power lines encircled by the dotted line C2 are formed through the wiring pattern formation process. More specifically, a fifth power line 47 extends parallel to the second power line 44. A sixth power line 48 extends transversely to the second power line 44 and is connected to the fifth power line 47 through a via hole (not shown) . A seventh power line 49 extends transversely to the fifth power line 47 and is connected to the second power line 44 through a via hole (not shown).

The seventh power line 49 has two distal portions extending from its main body. The two distal portions are connected to the second power line 44. The sixth power line 48 extends through the space defined between the two distal portions and is connected to the fifth power line 47.

In this manner, the fourth and seventh power lines 46, 49 are connected to the second power line 44 within the widths of the fourth and seventh power lines 46, 49, and the third and sixth power lines 45, 48 are connected to the first and fifth power lines 43, 47, respectively. Accordingly, an increase in the area of the semiconductor integrated circuit device 40 is prevented.

As described above, the advantages of the semiconductor integrated circuit device 40 and the wiring process of the preferred embodiment have the advantages described below.

(1) The overlap detection of step 12 and the elimination of the overlapping portion to form the avoidance patterns (33a, 33b, 33c) in step 13 enables connection of the power lines 33, 34, which have different potentials, to the corresponding power lines 31, 32.

(2) Since the avoidance patterns 33a–33c are checked in step 14, the formation of avoidance patterns that do not satisfy the predetermined requirements are not formed and correction of such patterns is thus not necessary. This prevents an increase in the design time of the power lines.

(3) When the formation of the second avoidance pattern is not possible, the conventional methods are used to form the avoidance patterns of the power supply lines (step 17). This prevents non-connection of the power lines.

(4) The elimination area 35 is formed such that the line clearance determined by predetermined design standards are ensured. This prevents the occurrence of design violations of the related lines 33, 34.

It should be apparent to those skilled in the art that the present invention may be embodied in many other specific forms without departing from the spirit or scope of the invention. Particularly, it should be understood that the present invention may be embodied in the following forms.

Figure 15:
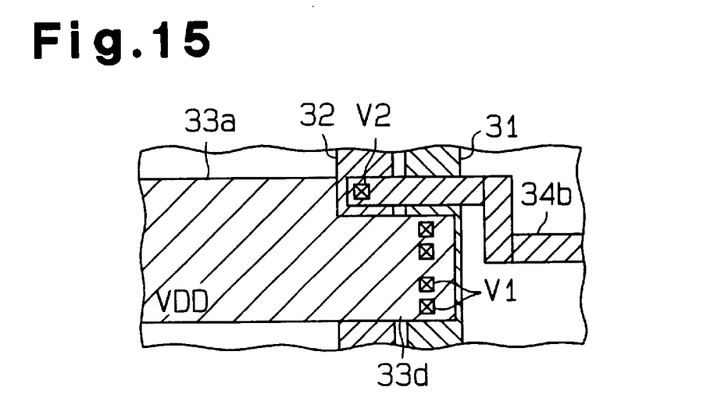
FIGS. 15 to 18 are schematic diagrams showing further embodiments of wiring patterns having overlap avoidance lines in accordance with the present invention.

(a) The location of the elimination area 35 may be changed. For example, as shown in FIG. 15, an avoidance pattern having only one distal portion 33d may be formed by eliminating an upper corner of the left power line 33. The right power line 34b is bent to avoid the distal portion 33d. In this case, the width of the distal portion 33d of FIG. 15 is greater than the total of the widths of the two distal portions 33b, 33c by the predetermined standard clearance. In other words, even if the avoidance pattern of FIG. 10 does not satisfy the power line conditions, the circuit pattern of FIG. 15 satisfies the power line requirements. Accordingly, the example of FIG. 15 enables flexible designing of the avoidance patterns.

Figure 16:
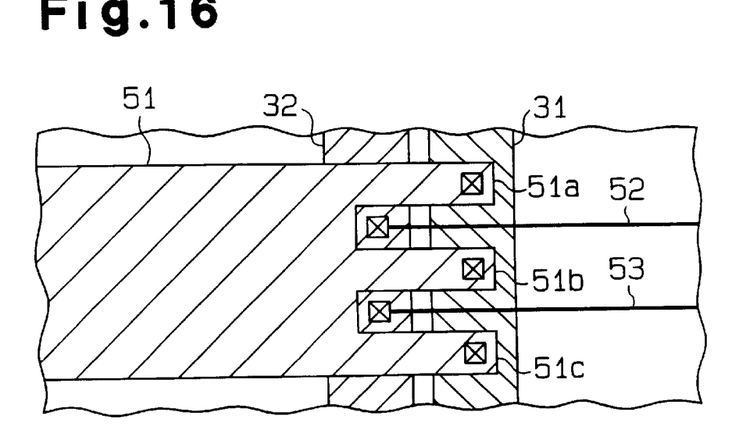

(b) The avoidance pattern may be designed for two or more lines. For example, as shown in FIG. 16, the method of the present invention may be applied to three lines 51, 52, 53. In the example of FIG. 16, the two right power lines 52, 53 are overlapped with the left wide power line 51. Two overlapping portions are eliminated from the wide left power line 51 to define three distal portions 51a, 51b, 51c.

If the avoidance pattern does not satisfy the wiring requirements, a second avoidance pattern is formed. For example, a portion of the wide power line 51 that overlaps one of the two lines (in this case, the line 52) is eliminated to form an avoidance pattern having two distal portions. If this avoidance pattern satisfies the wiring requirements, the other line 53 is connected to the power line 32 using the conventional method. This enables the connection of different power lines within an area smaller than the area used in the prior art.

(c) A plurality of furcated lines may be used as the second avoidance pattern. If the furcated lines overlap a power line, the portions of the furcated lines overlapping the power line may be eliminated. This is preferable when the difference between the widths of the two overlapping lines is small.

Figure 17:
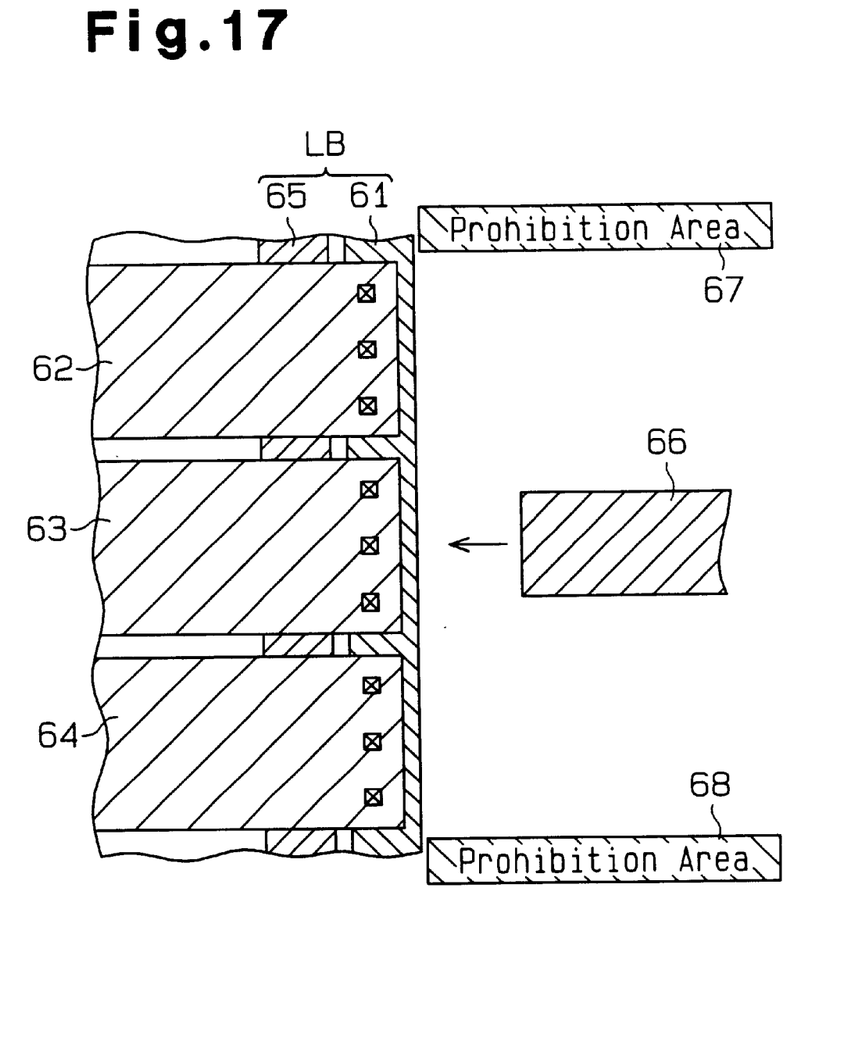
Figure 18:
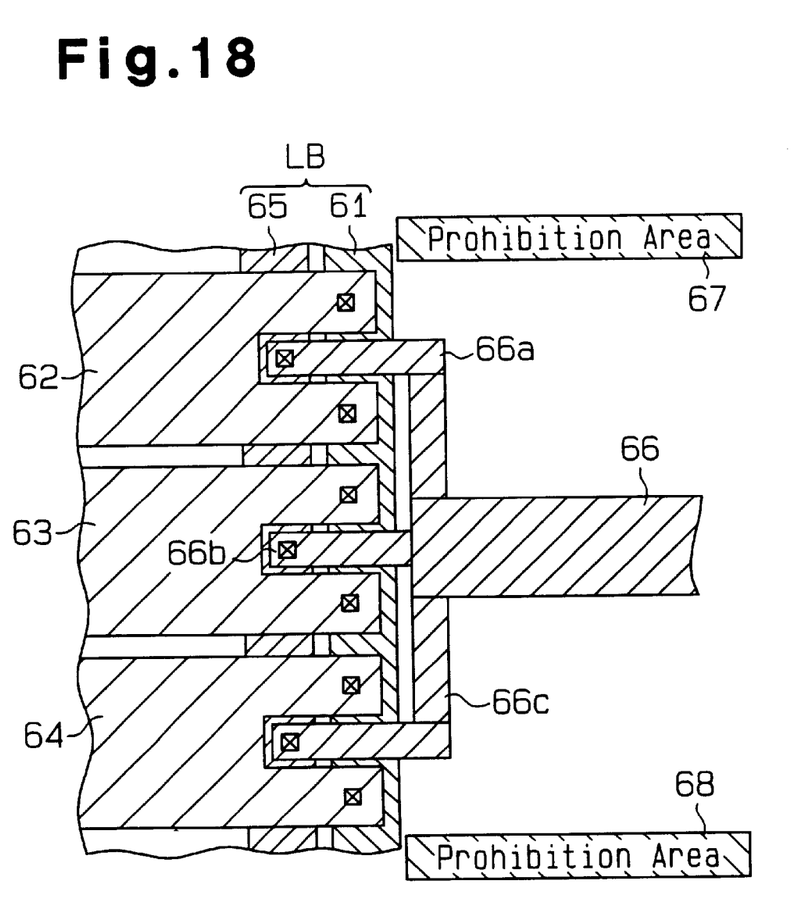

More specifically, as shown in FIG. 17, a lower right line 61 and a lower left line 65 are formed on the lower layer LB. Three upper left lines 62, 63, 64 are connected to the lower right line 61. The middle line 63 interferes with the connection of a right upper line 66 to a left lower line 65. If an avoidance pattern is formed on the middle line 63, the avoidance pattern does not satisfy the predetermined wiring requirements. Further, in this case, two wiring prohibition areas 67, 68 restrict the arrangement of the upper right line 66. In this case, a second avoidance pattern is formed as shown in FIG. 18. More particularly, three distal lines 66a, 66b, 66c are extended from the right line 66 toward the three left lines 62, 63, 64, respectively. The portions of the lines 62–64 overlapping the distal lines 66a–66c are eliminated. As a result, the lines 62–64 satisfy the predetermined wiring requirements. The method of the present invention connects the lines 66 and 65 without using another wiring layer LA as in the prior art method of FIGS. 4 and 5.

(d) In addition to the upper wiring layer LC, the method of the present invention may be applied to any wiring layer (i.e., the wiring layers LA, LB and layers above the upper wiring layer LC).

(e) The present invention may be applied when connecting various lines having certain widths, such as when connecting power lines to signal lines or when connecting signal lines to each other.

(f) In step 11 of FIG. 6, instead of forming a wiring pattern, a wiring pattern 21 prestored in the memories 4, 5 may be used.

(g) Although the present invention is realized through a program executed by a computer, hardware may also be used to realize the present invention.

The present examples and embodiments are to be considered as illustrative and not restrictive, and the invention is not to be limited to the details given herein, but may be modified within the scope and equivalence of the appended claims.

What is claimed is:

1. A method for forming a wiring pattern of a semiconductor integrated circuit including a first line for conducting to a first potential and a second line for conducting to a second potential, the method comprising the steps of:
   detecting a portion of a distal end of the first line that overlaps a distal end of the second line; and
   generating a first avoidance pattern by eliminating the overlapping portion from the first line.

2. The method according to claim 1, further comprising the steps of:
   checking whether the first avoidance pattern satisfies a predetermined wiring requirement; and
   forming a new first line having the first avoidance pattern when the wiring requirement is satisfied.

3. The method according to claim 2, further comprising the step of:
   determining whether the formation of a second avoidance pattern, which differs from the first avoidance pattern, is possible when the wiring requirement is not satisfied.

4. The method according to claim 3, wherein the first and second lines are arranged on a first wiring layer, the method further comprising the step of:

bending the second line on the first wiring layer or toward a second wiring layer, which differs from the first wiring layer, to avoid the first line when the formation of the second avoidance pattern is not possible.

5. The method according to claim 1, wherein the first line is wider than the second line.

6. The method according to claim 5, further comprising the step of:

setting an elimination area including the overlapping portion and an interline clearance that is greater than a predetermined design standard.

7. The method according to claim 1, wherein the avoidance pattern generating step includes:

forming a plurality of distal lines furcated from the second line; and generating the first avoidance pattern by eliminating a portion of the first line that overlaps at least one of the plurality of distal lines.

8. An apparatus for forming a wiring pattern of a semiconductor integrated circuit including a first line for conducting a first potential and a second line for conducting a second potential, the apparatus comprising:

a detector for detecting a portion of a distal end of the first line that overlaps a distal end of the second line; and a processor including an avoidance pattern generator for generating a first avoidance pattern by eliminating the overlapping portion from the first line.

9. A computer readable storage medium storing a program for forming a wiring pattern of a semiconductor integrated circuit including a first line for conducting a first potential and a second line for conducting a second potential, the program comprising the steps of:

detecting a portion of a distal end of the first line that overlaps a distal end of the second line; and generating a first avoidance pattern by eliminating the overlapping portion from the first line.

10. A method for connecting lines in a semiconductor integrated circuit including a first line for conducting a first potential, a second line for conducting a second potential, a third line for conducting the first potential, and a fourth line for conducting the second potential, wherein the first and second lines are arranged on a first layer, and the third and fourth lines are arranged on a second layer, the first line being connected to the third line, and the second line being connected to the fourth line, the method comprising the steps of:

detecting a portion of a distal end of the third line that overlaps a distal end of the fourth line;

generating a first avoidance pattern by eliminating the overlapping portion from the third line;

temporarily storing data of the first avoidance pattern in a memory;

determining whether the first avoidance pattern satisfies a predetermined wiring requirement;

forming a new third line having the first avoidance pattern when the wiring requirement is satisfied; and forming via holes connecting the first line to the new third line and the second line to the fourth line.

11. The method according to claim 10, further comprising the steps of:

checking whether the formation of a second avoidance pattern, which differs from the first avoidance pattern, is possible when the first avoidance pattern does not satisfy the wiring requirement; and forming a new third line having the second avoidance pattern when the formation of the second avoidance pattern is possible and the second avoidance pattern satisfies the wiring requirement.

12. The method according to claim 11, wherein the new third line having the second avoidance pattern forming step includes:

eliminating a corner of the distal end of the third line; and arranging the distal end of the fourth line at the position where the corner was located.

13. The method according to claim 11, wherein the third line is one of a plurality of the third lines, the new third line having the second avoidance pattern forming step including:

forming a plurality of distal lines furcated from the fourth line in correspondence with the plurality of third lines; and eliminating a portion of each of the third lines that overlaps a corresponding one of the plurality of distal lines.

14. The method according to claim 11, wherein the new third line having the second avoidance pattern forming step includes:

forming a plurality of distal lines furcated from the fourth line; and eliminating a portion of the third line that overlaps at least one of the plurality of distal lines.

* * * * *